US012603641B2

(12) United States Patent
Obayashi

(10) Patent No.: US 12,603,641 B2
(45) Date of Patent: Apr. 14, 2026

(54) DIGITAL FILTER CIRCUIT, DIGITAL FILTERING METHOD, AND STORAGE MEDIUM STORING DIGITAL FILTERING PROGRAM

(71) Applicant: METACUBE CO., LTD., Tokyo (JP)

(72) Inventor: Masaharu Obayashi, Tokyo (JP)

(73) Assignee: METACUBE CO., LTD., Tokyo (JP)

( * ) Notice: Subject to any disclaimer, the term of this patent is extended or adjusted under 35 U.S.C. 154(b) by 0 days.

(21) Appl. No.: 19/113,919

(22) PCT Filed: Sep. 21, 2023

(86) PCT No.: PCT/JP2023/034226
§ 371 (c)(1),
(2) Date: Mar. 21, 2025

(87) PCT Pub. No.: WO2024/063120
PCT Pub. Date: Mar. 28, 2024

(65) Prior Publication Data
US 2025/0266810 A1 Aug. 21, 2025

(30) Foreign Application Priority Data
Sep. 21, 2022 (JP) ................................. 2022-150133

(51) Int. Cl.
*H03H 17/02* (2006.01)
(52) U.S. Cl.
CPC .... *H03H 17/0202* (2013.01); *H03H 17/0219* (2013.01); *H03H 17/0233* (2013.01)

(58) Field of Classification Search
CPC .... H03H 17/00–08; A61B 5/72; A61B 5/725; A61B 5/7278; A61B 5/7282; A61B 5/7285
See application file for complete search history.

(56) References Cited

U.S. PATENT DOCUMENTS

| | | | | | |
|---|---|---|---|---|---|
| 6,041,339 | A | * | 3/2000 | Yu | H03H 17/0664 708/313 |
| 6,474,164 | B1 | * | 11/2002 | Mucciardi | G01N 29/40 73/628 |
| 2016/0317097 | A1 | * | 11/2016 | Adams | A61B 5/02416 |

FOREIGN PATENT DOCUMENTS

| | | | | |
|---|---|---|---|---|
| EP | 0110555 | A2 | * | 6/1984 | ......... H03H 11/1252 |
| JP | H088464 | B2 | | 1/1996 | |
| JP | H10190408 | A | | 7/1998 | |
| JP | 2002501225 | A | | 1/2002 | |

(Continued)

*Primary Examiner* — Andrew Caldwell
*Assistant Examiner* — Huy Duong
(74) *Attorney, Agent, or Firm* — Bayramoglu Law Offices LLC

(57) ABSTRACT
A digital filter circuit includes retrieve stream data as a digital signal, and cyclically operate a first phase and a second phase. The circuit includes a short-term storage unit configured to store a local state variable, a long-term storage unit configured to store a global state variable, a first phase synthesizing unit that outputs the digital signal in the first phase under an influence of the local state variable stored in the short-term storage unit, and a second phase synthesizing unit that outputs the digital signal in the second phase under an influence of the global state variable stored in the long-term storage unit, where an output from the first phase synthesizing unit and an output from the second phase synthesizing unit are caused to generate an interference due to a phase shift.

17 Claims, 18 Drawing Sheets

(56)        References Cited

FOREIGN PATENT DOCUMENTS

JP          2018534188  A      11/2018
JP          2022505997  A       1/2022

* cited by examiner

FIG. 3A

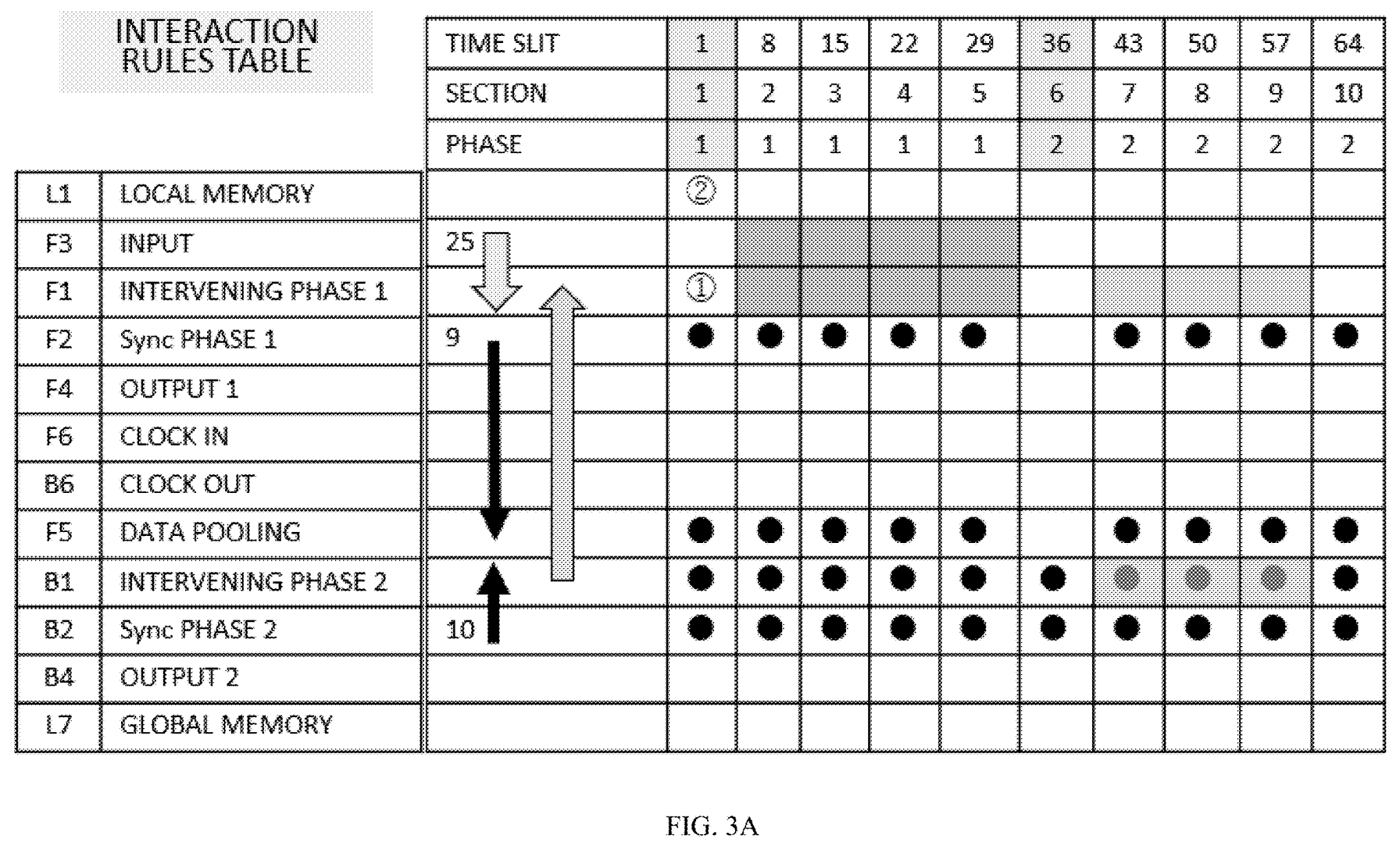

INTERACTION RULES TABLE

| TIME SLIT | | 1 | 8 | 15 | 22 | 29 | 36 | 43 | 50 | 57 | 64 |
|---|---|---|---|---|---|---|---|---|---|---|---|
| SECTION | | 1 | 2 | 3 | 4 | 5 | 6 | 7 | 8 | 9 | 10 |
| PHASE | | 1 | 1 | 1 | 1 | 1 | 2 | 2 | 2 | 2 | 2 |
| L1 | LOCAL MEMORY | ② | | | | | | | | | |
| F3 | INPUT | | | | | | | | | | |
| F1 | INTERVENING PHASE 1 | ① | | | | | | | | | |
| F2 | Sync PHASE 1 | ● | ● | ● | ● | ● | | ● | ● | ● | ● |
| F4 | OUTPUT 1 | | | | | | | | | | |
| F6 | CLOCK IN | | | | | | | | | | |
| B6 | CLOCK OUT | | | | | | | | | | |
| F5 | DATA POOLING | ● | ● | ● | ● | ● | | ● | ● | ● | ● |
| B1 | INTERVENING PHASE 2 | ● | ● | ● | ● | ● | ● | ● | ● | ● | ● |
| B2 | Sync PHASE 2 | ● | ● | ● | ● | ● | ● | ● | ● | ● | ● |
| B4 | OUTPUT 2 | | | | | | | | | | |
| L7 | GLOBAL MEMORY | | | | | | | | | | |

| EXTERNAL SENSORS | | SPECIFIC EXAMPLES | Level 1 | Level 2 | Level 3 |
|---|---|---|---|---|---|
| 1 | IMAGE | CAMERA, STILL IMAGE, VIDEO, MOVIE, TEXT, SHAPE, MAP, 3D | ▨ | | |
| 2 | SOUND | MICROPHONE, VIDEO, MUSIC, AUDIO, MOVIE, SONAR | | | |
| 3 | FEVER | THERMOMETER, THERMOMETER | | | |
| 4 | CHEMICALS | ODOR SENSOR, COMPOSITION ANALYSIS, PCR ANALYSIS | | ▨ | |
| 5 | GRAVITY, PRESSURE, VIBRATION | PRESSURE GAUGE, OIL PRESSURE METER, SEISMOMETER, GYRO SENSOR | | | |
| 6 | MAGNETISM, ELECTROMAGNETIC WAVES, RADIATION | MRI, AMPLIFIER, RADAR, GEIGER COUNTER | | | |
| 7 | ATTRIBUTE-VALUE PAIRS | RDB, WEB RESOURCES | | | |
| 8 | LANGUAGE | BOOKS, PAPERS, LECTURES, FILMS, HISTORY, NEWS, KNOWLEDGE | | | ▨ |
| 9 | ORGANISM | MEDICAL TEST DATA, MEDICAL RECORD INFORMATION, ADVERSE DRUG EVENTS | | | ▨ |

| EXTERNAL ACTION DESTINATION | | SPECIFIC EXAMPLES | Level 1 | Level 2 | Level 3 |
|---|---|---|---|---|---|
| 1 | IMAGE | DISPLAY, PROJECTION MAPPING | ▨ | | |
| 2 | SOUND | SPEAKERS, MUSICAL INSTRUMENTS | | | |
| 3 | VIDEO | VR, AR | | ▨ | |
| 4 | ACTUATOR | SERVO MOTOR, ELECTRIC, HYDRAULIC, PNEUMATIC | | | |
| 5 | DEVICE | ROBOTS, DRONES, AUTONOMOUS DRIVING, AUTOMATED DIAGNOSTICS | | | ▨ |

FIG. 8

```
print(Sen[q][:][:])
print(Out[q][:][:])

[[1 1 3 4 5]
 [5 6 0 7 8]
 [2 0 4 7 9]
 [5 8 9 0 7]
 [8 5 3 6 0]]
[[-0.50774792 -0.50774792 -0.52110964 -0.5277905 -0.53447136]
 [-0.53447136 -0.54115222 -0.50106706 -0.54783308 -0.55451394]
 [-0.51442878 -0.50106706 -0.5277905 -0.54783308 -0.5611948 ]
 [-0.53447136 -0.55451394 -0.5611948 -0.50106706 -0.54783308]
 [-0.55451394 -0.53447136 -0.52110964 -0.54115222 -0.50106706]]
```

DIGITAL FILTER CIRCUIT, DIGITAL FILTERING METHOD, AND STORAGE MEDIUM STORING DIGITAL FILTERING PROGRAM

CROSS-REFERENCE TO THE RELATED APPLICATIONS

This application is the national phase entry of International Application No. PCT/JP2023/034226, filed on Sep. 21, 2023, which is based upon and claims priority to Japanese Patent Application No. 2022-150133, filed on Sep. 21, 2022, the entire contents of which are incorporated herein by reference.

TECHNICAL FIELD

The present invention relates to a digital filter circuit, a digital filtering method, and a storage medium storing a digital filtering program.

BACKGROUND

Various digital filters have been developed to date.

For example, Japanese Examined Patent Application Publication No. H08-8464 discloses a digital filter in which a non-linear conversion unit is inserted into a feedback loop, whereby a distortion component attributed to the non-linear conversion unit is cumulatively generated so as to impart a harmonic component to a signal on the feedback loop, and music sound having rich sound quality can be generated like an analog filter.

Japanese Unexamined Patent Application Publication No. H10-190408 discloses a state-variable multimode digital filter in which a non-linear circuit having soft-limiter characteristics is inserted in an accumulator (an integrator) including an adder and a delay circuit configured to make a delay for one sample period, whereby the digital filter can impart appropriate distortion to an inputted signal without suddenly clipping the signal even when the adder exceeds an overflow limit.

Previous Technical Documents

Patent Documents

Patent Document 1: Japanese Examined Patent Application Publication No. H08-8464
Patent Document 2: Japanese Unexamined Patent Application Publication No. H10-190408

SUMMARY

The Problems to be Solved by the Present Invention

Here, the state-variable multimode digital filter with the non-linear circuit inserted in the accumulator (the integrator) as described above is focused on restriction of an oscillation level. This configuration achieves a very stable operation when oscillated, but exhibits quite poor emphasizing behaviors such as amplifying or sharpening an input signal.

The present invention has been made in view of the aforementioned problem of the related art. An object of the present invention is to provide a digital filter circuit, a digital filtering method, and a storage medium storing a digital filtering program, which enable a cyclic state-variable digital filter circuit to perform amplification or emphasis such as smoothening and sharpening of an input signal favorably (desirable response and characteristics).

Technical Solutions

The present invention has been made in view of the foregoing problem, and has an objective to provide a digital filter circuit. According to one aspect of the present invention, a digital filter circuit includes retrieve stream data as a digital signal, and cyclically operate a first phase and a second phase. The circuit includes a short-term storage unit configured to store a local state variable, a long-term storage unit configured to store a global state variable, a first phase synthesizing unit configured to output the digital signal in the first phase under an influence of the local state variable stored in the short-term storage unit, and a second phase synthesizing unit configured to output the digital signal in the second phase under an influence of the global state variable stored in the long-term storage unit, wherein an output from the first phase synthesizing unit and an output from the second phase synthesizing unit are caused to generate an interference due to a phase shift.

According to another aspect of the present invention, the short-term storage unit stores, as the local state variable, data obtained by superposing charged states of respective cells constituting the digital filter circuit in a short term.

According to still another aspect of the present invention, the long-term storage unit stores, as the global state variable, data obtained by superposing the charged states of the respective cells constituting the digital filter circuit in a long term.

According to still another aspect of the present invention, the first phase synthesizing unit reaches firing and performs output when superposition of the digital signal and the local state variable exceeds a predetermined threshold in the first phase.

According to still another aspect of the present invention, the second phase synthesizing unit reaches firing and performs output when superposition of the digital signal and the global state variable exceeds a predetermined threshold in the second phase.

According to still another aspect of the present invention, the stream data is any of image data, sound data, heat data, chemical substance data, gravity data, pressure data, vibration data, magnetic wave data, electromagnetic wave data, radiation data, an attribute value pair, language data, and biological data.

According to still another aspect of the present invention, an interference pattern to be outputted from each of the first phase synthesizing unit and the second phase synthesizing unit is any of an image, a sound, a moving image, an actuator control signal, or a device control signal.

BRIEF DESCRIPTION OF THE DRAWINGS

Figure 3B:
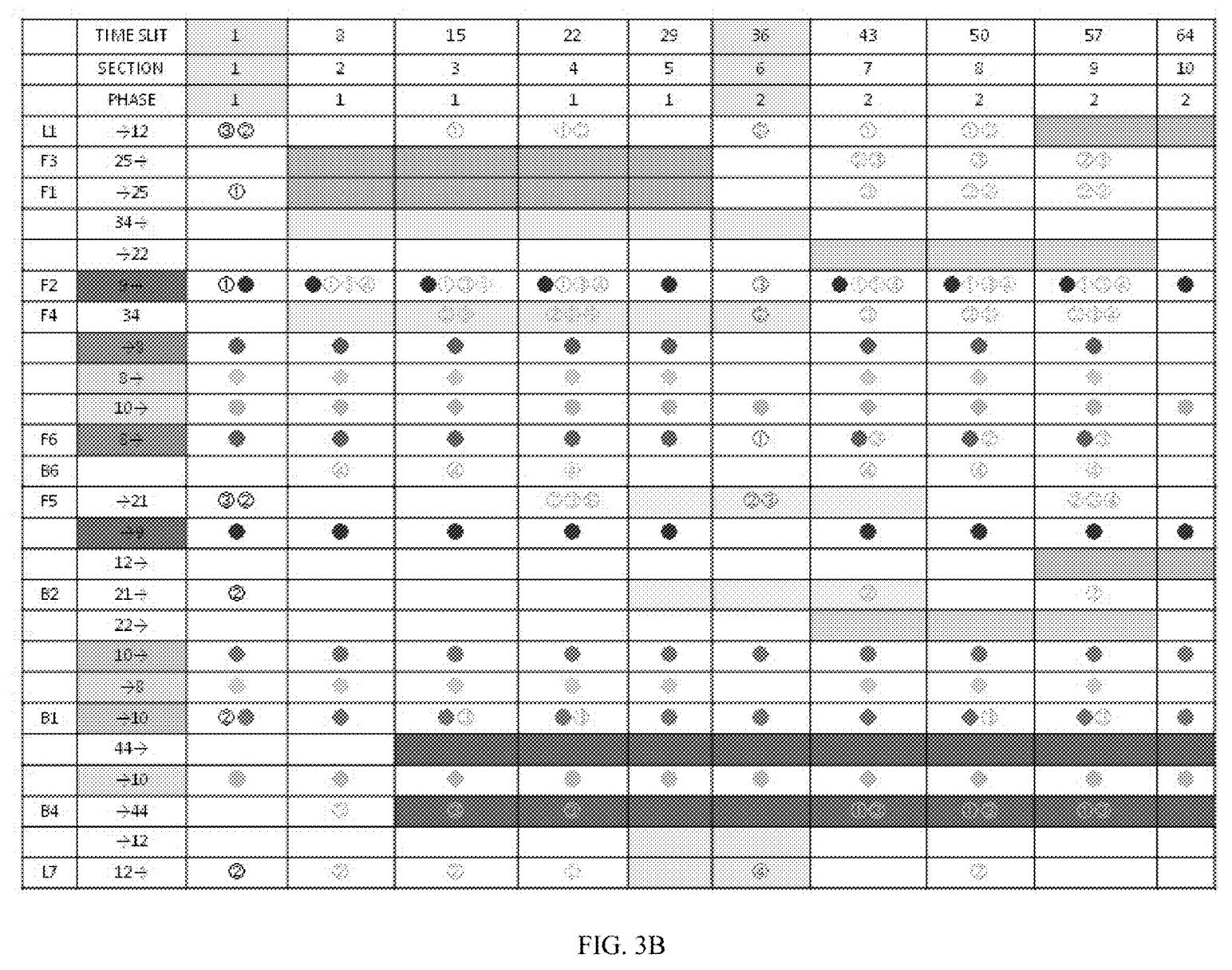

FIGS. 3A to 3D are diagrams showing an example of mounting a digital filter circuit unit showing interactive relations among respective cells and processing in each time slit.

FIG. 6B shows the table at the lower right corner of FIG. 6A.

FIG. 8 is a diagram showing fields of application of the digital filter circuit of the present invention.

FIG. 11 is a diagram showing a data example of interaction rules and the like.

DETAILED DESCRIPTION OF THE EMBODIMENTS

An embodiment of the present invention will be described below with reference to the drawings.

Figure 1:
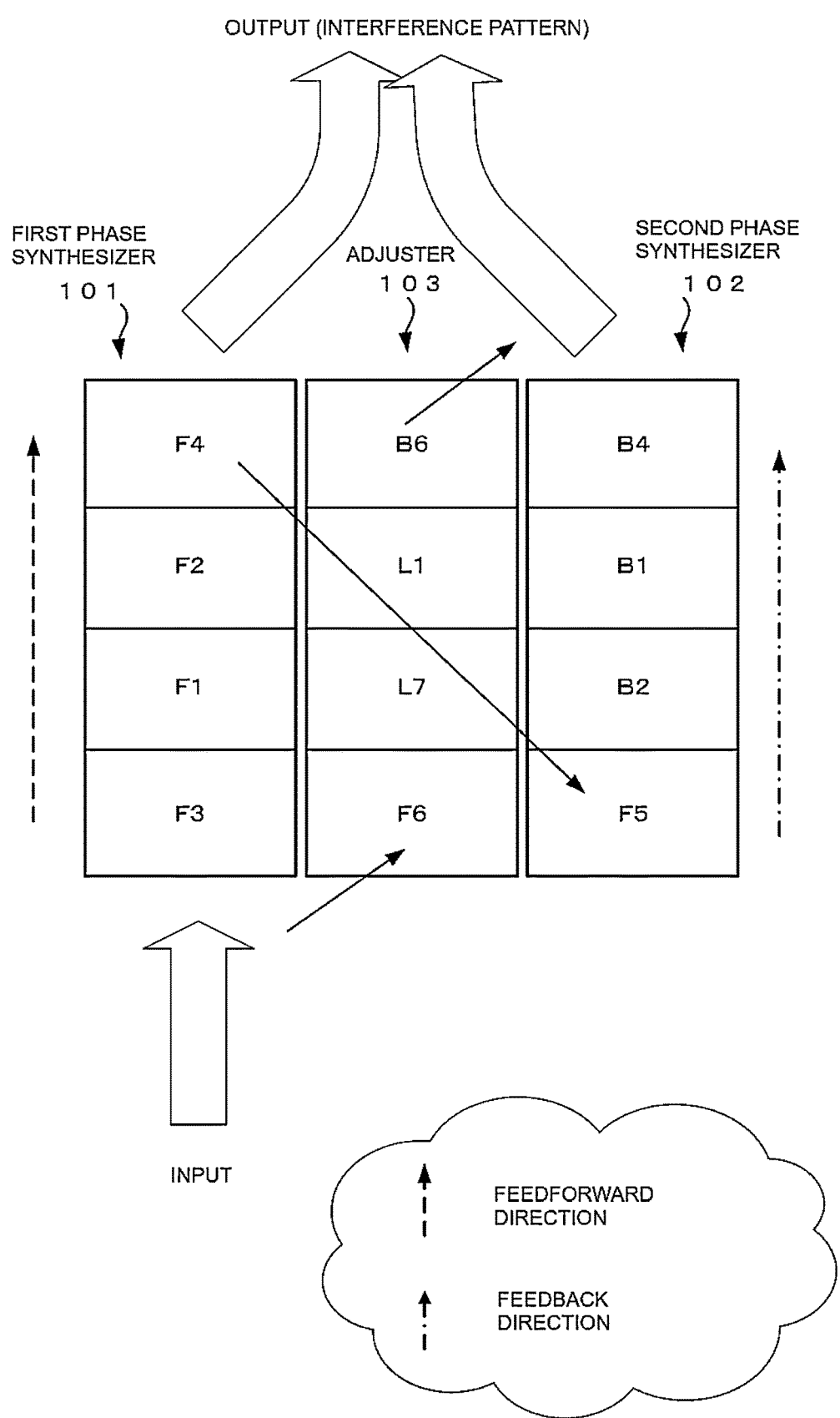
FIG. 1 is a diagram showing a configuration of a digital filter according to a first embodiment of the present invention.

FIG. 1 is a diagram showing a configuration of a digital filter according to a first embodiment of the present invention. This digital filter is a digital filter circuit that retrieves stream data as a digital signal, and cyclically operates a first phase and a second phase, which includes a first phase synthesizer 101 and a second phase synthesizer 102. An output from the first phase synthesizer 101 and an output from the second phase synthesizer 102 are caused to generate an interference due to a phase shift. Moreover, the digital filter according to the present embodiment includes an adjuster 103.

Among them, the first phase synthesizer 101 is a first phase synthesizing unit that outputs the digital signal in the first phase under the influence of a local state variable stored in a short-term storage unit. The short-term storage unit may be provided to the first phase synthesizer 101 itself or provided to a different constituent of the digital filter circuit. This short-term storage unit stores data obtained by superposing charged states of respective cells constituting the digital filter circuit in a short term as the local state variable. The first phase synthesizer 101 reaches firing and performs output when the superposition of the digital signal and the local state variable exceeds a predetermined threshold in the first phase.

The second phase synthesizer 102 is a second phase synthesizing unit that outputs the digital signal in the second phase under the influence of a global state variable stored in a long-term storage unit. The long-term storage unit may be provided to the second phase synthesizer 102 itself or provided to a different constituent of the digital filter circuit. This long-term storage unit stores data obtained by superposing the charged states of the respective cells constituting the digital filter circuit in a long term as the global state variable. The second phase synthesizer 102 reaches firing and performs output when the superposition of the digital signal and the local state variable exceeds a predetermined threshold in the second phase.

While an optional signal may be inputted herein, an example of stream data (also referred to as data stream) to be inputted is time-series data such as wave data. For instance, the stream data may be image data, sound data, heat data, chemical substance data, gravity data, pressure data, vibration data, magnetic wave data, electromagnetic wave data, radiation data, attribute value pairs, language data, or biological data. On the other hand, while an optional signal may be outputted in response to the inputted signal, an interference pattern to be outputted from each of the first phase synthesizer 101 and the second phase synthesizer 102 may be an image, a sound, a video, an actuator control signal, or a device control signal.

Furthermore, as a detailed example, the first phase synthesizer 101, the second phase synthesizer 102, and the adjuster 103 in the present embodiment are formed from cells (F1 to F6, B1, B2, B4, B6, L1, and L7) as illustrated. Each cell simulates a biological cell. For example, a cell simulating a nerve cell reaches firing when the superposition of the digital signal on an input side connected like a synapse and the state variable representing the charged state exceeds a predetermined threshold, and carries out signal output to an output side connected like a synapse. Here, connection lines of the respective constituents (the first phase synthesizer 101, the second phase synthesizer 102, and the adjuster 103) and the respective cells (F1 to F6, B1, B2, B4, B6, L1, and L7) may be omitted in some cases in FIG. 1, the respective constituents and/or the respective cells can be configured to be connectable with optional connection lines as needed.

The digital filter circuit according to the present embodiment is a semiconductor element unit devised based on the principle of operation of a biological neural circuit. As shown in FIG. 1, one unit of the digital filter circuit is formed from ten unique cells (F1 to F6, B1, B2, B4, and B6) and two state retention cells (L1 and L7). Here, an organ may be artificially formed by combining multiple units of the digital filter circuits of the same type, or an artificial neural network may be formed by coordinating different types of organs.

As shown in FIG. 1, the element unit of the digital filter circuit is formed from the ten unique cells (F1 to F6, B1, B2, B4, and B6) and the two state retention cells (L1 and L7). The respective cells are referred to as F3, F1, F2, F4, F5, F6, B1, B2, B4, B6, L1, and L7 as shown in FIG. 1. This configuration is referred to as L4t4 (Layered Elements: 4 feedforward and time sliced 4 feedback) model, which is an intelligence model formed from an assembly having seven layers (a number affixed to a name of each cell represents a number of the layer), and is configured such that four types of elements of four feedforward cells (F3, F1, F2, and F4) and four feedback cells (F5, B1, B2, and B4), respectively, are time-shared and operated synchronously with surrounding alignment cells (F6 and B6). As will be described later, according to an apparatus, a method, a program, and a data structure implementing the L4t4 model, it is possible to obtain a simulation result which has been unavailable from the conventional artificial intelligence. Although not illustrated, a group of cells to detect an external change may further be provided on an input side and a group of external action target cells (such as an actuator device) may further be provided on an output side. These cells are cyclically operated synchronously and in coordination with one another. As an example, the external sensor digitalizes stream data from one or more external sources and retrieves the stream data into the external sensor. The group of external action target cells may carry out output such as display by rendering output (internal digital data) from the first phase synthesizer 101 (the cell F4) and the second phase synthesizer 102 (the cell B4) into the stream data (such as wave data), or work on a servo motor or an actuator corresponding to muscle fibers of a biological body with an output signal like robot control. Multiple element units are connected to constitute the digital filter circuit.

One operation cycle of each unit is divided into two phases. The cells F3, F1, F2, and F4 constituting the first phase synthesizer 101 are mainly engaged in the first phase, and the cells F5, B1, B2, and B4 constituting the second phase synthesizer 102 are mainly engaged in the second phase.

Among them, the cell L1 is a cell that assumes a local memory. In the present embodiment, the cell L1 is the short-term storage unit to perform short-term storage of the local state variables that make an impact on a reaction of the cell F4. Specifically, the cell L1 stores the data obtained by superposing the charged states of the respective cells constituting the digital filter circuit in a short term as the local state variables.

The cell F3 is a cell that assumes input. The cell F3 accepts the input from the external sensor (the external source). When there is a connection target unit on the network, the cell F3 can also receive superposed output from an internal unit.

The cell F1 is a cell that assumes first phase intervention. The cell F1 intervenes in signal transmission among the cells F3, F2, and F4.

The cell F2 is a cell that assumes first phase synchronization. The cell F2 mainly controls timing among the internal cells engaged in F4 cell output in the first phase.

The cell F4 is a cell that assumes the output in the first phase. The cell F4 outputs a digital value obtained by the superposition of the inputted wave data depending on the state of the cell L1. Specifically, the cell F4 of the first phase synthesizer 101 reaches firing and performs output in the case where the superposition of the digital signal transmitted through the cells F3, F1, and F2 and the local state variable stored in the cell L1 being the short-term storage unit exceeds a predetermined threshold in the first phase.

The cell F6 is a cell that assumes in-clock. The cell F6 receives the signal of the timing to start the first phase from the input (in) side connection unit.

The cell B6 is a cell that assumes out-clock. The cell B6 sends the signal of the start timing to the connection unit on the output (out) side.

The cell F5 is a cell that assumes pooling, which accumulates the values of the respective units in the F4 cells. Specifically, the cell F5 accumulates the values outputted from the cell F4 of the connection units of the input (in) side.

The cell B1 is a cell that assumes second phase intervention. The cell B1 intervenes in signal transmission among the cells F5, B2, and B4.

The cell B2 is a cell that assumes second phase synchronization. The cell B2 mainly controls timing among the internal cells engaged in B4 cell output in the second phase.

The cell B4 is a cell that assumes the output in the second phase. The cell B4 determines a digital value of its own unit and outputs and digital value in response to the values accumulated (aggregated) in the cell F5 depending on the state of the cell L7. Specifically, the cell B4 of the second phase synthesizer 102 reaches firing and performs output in the case where the superposition of the digital signal transmitted through the cells F5, B2, and B1 and the global state variable stored in the cell L7 being the long-term storage unit exceeds a predetermined threshold.

The cell L7 is a cell that assumes the global memory. In the present embodiment, the cell L7 is the long-term storage unit that stores the global state variables that make an impact on a reaction of the cell B4. Specifically, the cell L7 stores the data obtained by superposing the charged states of the respective cells constituting the digital filter circuit in a long term as the global state variables.

Figure 2:
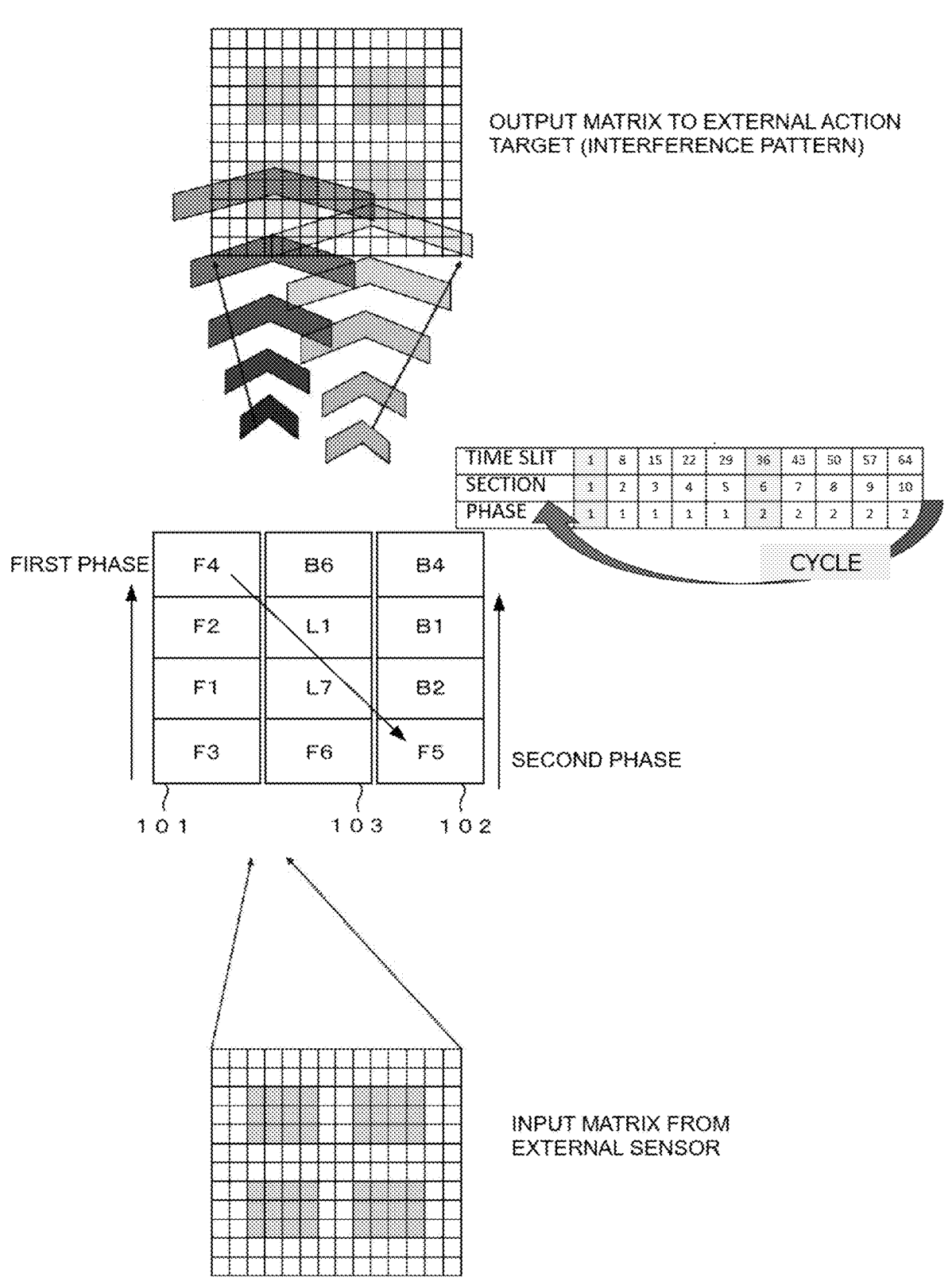
FIG. 2 is a diagram schematically showing a case where a matrix (such as a digital image signal) is inputted as an input digital signal from an external sensor to an element unit of a digital filter circuit and an interference pattern is outputted as an output matrix to an external action target.
Figure 3C:
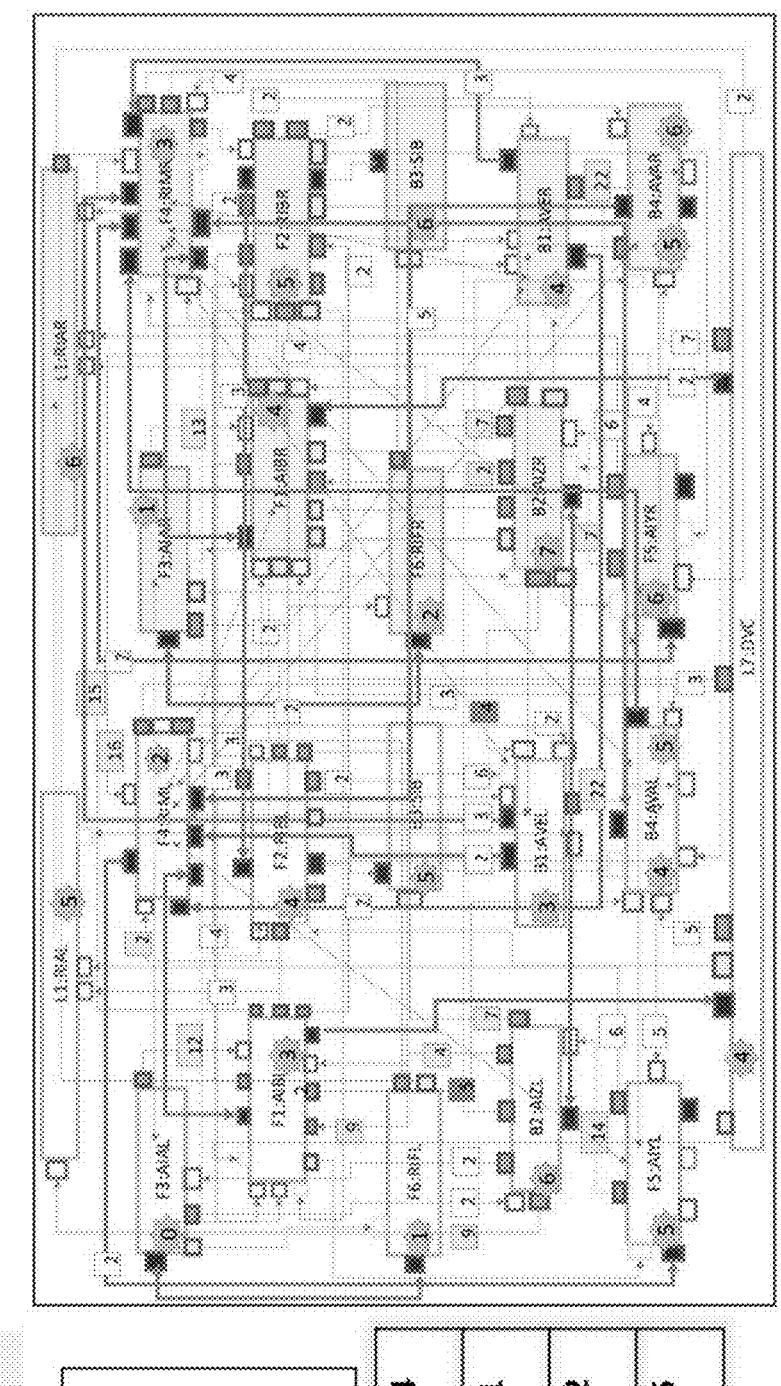
Figure 3D:
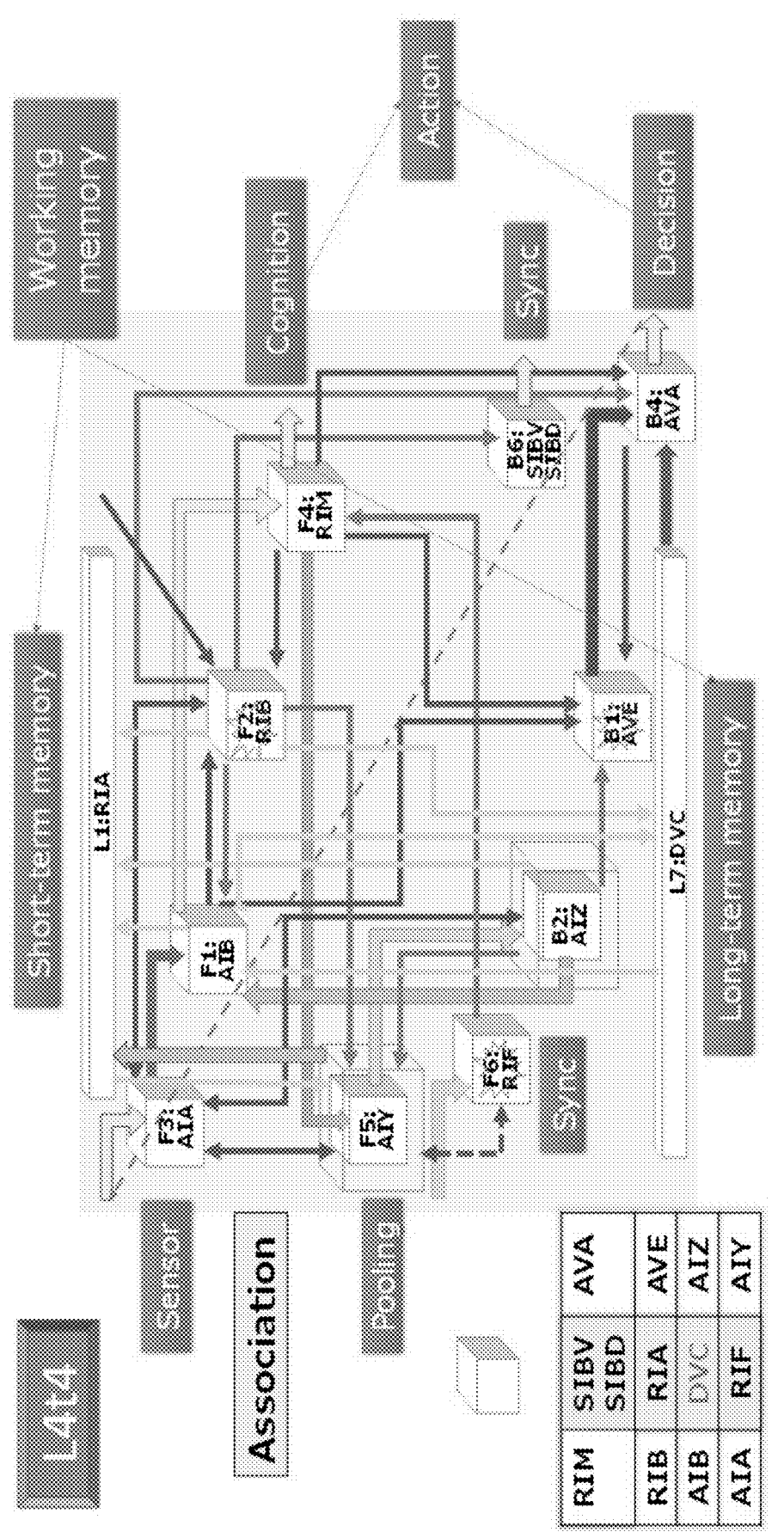

Here, FIG. 2 is a diagram schematically showing a case where a matrix (such as a digital image signal) is inputted as an input digital signal from the external sensor to the element unit of the digital filter circuit and an interference pattern is outputted as an output matrix to an external action target.

As shown in FIG. 2, the cells F3, F1, F2, and F4 constituting the first phase synthesizer 101 carries out processing concerning the first phase. The cells F5, B1, B2, and B4 constituting the second phase synthesizer 102 carries out processing concerning the second phase. This processing of the first phase and the second phase is carried out cyclically and repeatedly. The processing for one cycle to be executed by each cell is divided into ten sections. To be more precise, the processing is carried out in 64 time slits.

Here, FIGS. 3A to 3D are diagrams showing an example of mounting the digital filter circuit unit showing interactive relations among the respective cells and the processing in each time slit. This mounting example is merely an example and the present invention is not limited to this example. The present invention is not limited to this example, and the digital filter circuit can be mounted in various embodiments as long as the object and the operation and effects of the present invention are attained. An interaction rule table defines exchanges among the cells. A circuit diagram indicated by L4t4 is a diagram showing exchanges of signals. Types of connection signals are distinctively expressed in response to directions and the numbers of the signals. A connection line corresponding to a gap junction is indicated with a thick arrow and a connection line corresponding to a chemical junction is indicated with a thin arrow. A transmission side (solid) and a reception side (not solid) are distinguished by a difference of the terminal. There are three types of the signal types in response to the difference of the number of the signals. The signal having the number of the signal equal to one is issued as a reset signal, and the signals having the numbers of signals in a range from 2 to 12 is periodically issued as a synchronous trigger signal or a reset signal. The signal having the number of the signal equal to or above 12 is issued as a timer signal (a continuous pulse signal).

As described above, in the L4t4 mounting example being the mounting example of the present embodiment, the timing control is constructed from 68 time slits and 10 sections as a whole, and one section has a 7-time-slit width (however, a tenth section has a 5-time-slit width. The first phase corresponds to first to fifth sections, and the second phase corresponds to sixth to tenth sections. In this L4t4 digital filter circuit, there are three repressive cells F6, F2, and B2. These cells issue the reset signals and the synchronous signals in accordance with the designated interaction rule table. Other excitatory cells transmit the pulse signal which is continuous between the cells to the cell on the other side. Depending on the intensity of the signal and the state of charges (a charged state) accumulated in a certain period, the synchronous signal serves as a trigger and the hyperpolarization and depolarization of the cells periodically occur.

In the first section, the cycle (the first phase and the second phase) is initialized by processing the reset signal. In the second to fourth sections, a waveform that indicates the firing state of the cell F4 is generated. In the sixth section, reset processing of the second phase is executed. In the seventh to ninth sections, a waveform mainly reflecting firing of the cell B4 is generated.

As described above, in the first phase, the cell F4 depends on the local state variable stored in the cell L1, and outputs the digital value obtained from the superposition of the input waveform data. In the second phase, the cell B4 determines the digital value of its own unit and outputs and digital value in response to the values accumulated (aggregated) in the cell F5 depending on the global state variable stored in cell L7. Accordingly, the signals outputted from these two phases with a time difference interfere with each other due to a phase shift, and become an output matrix forming an interference pattern.

Accordingly, factors that the output values of this digital filter circuit unit depend on are the wave pattern of the input of the cell F3, the interference due to the phase shift between the cells F4 and B4, changes in state values of the cells L1 and L7, and changes in pooling values in the cell F5.

Figure 4:
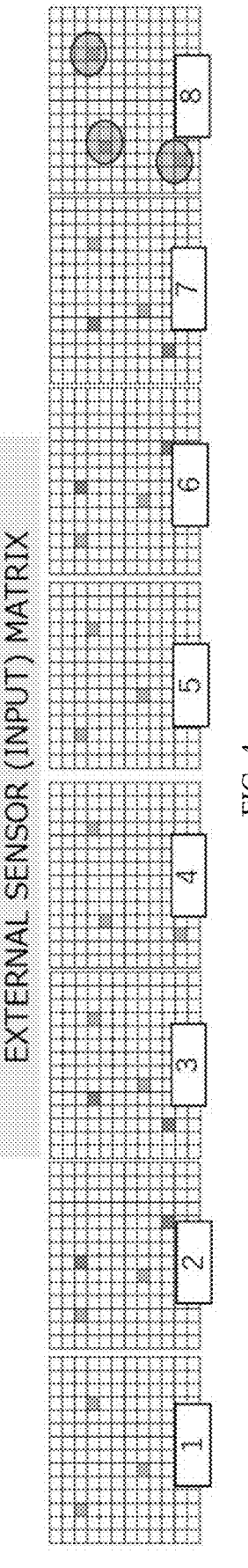
FIG. 4 is a diagram showing transition examples in time slits 1 to 8 in an input matrix inputted from the external sensor.

An example (a result of simulation) of the element unit of the digital filter circuit mounted as described above will be described below. FIG. 4 is a diagram showing transition examples in time slits 1 to 8 in an input matrix inputted from the external sensor. As shown in FIG. 4, the input signal is inputted to the cell F3 as time transient stream data (such as wave data).

Figure 5:
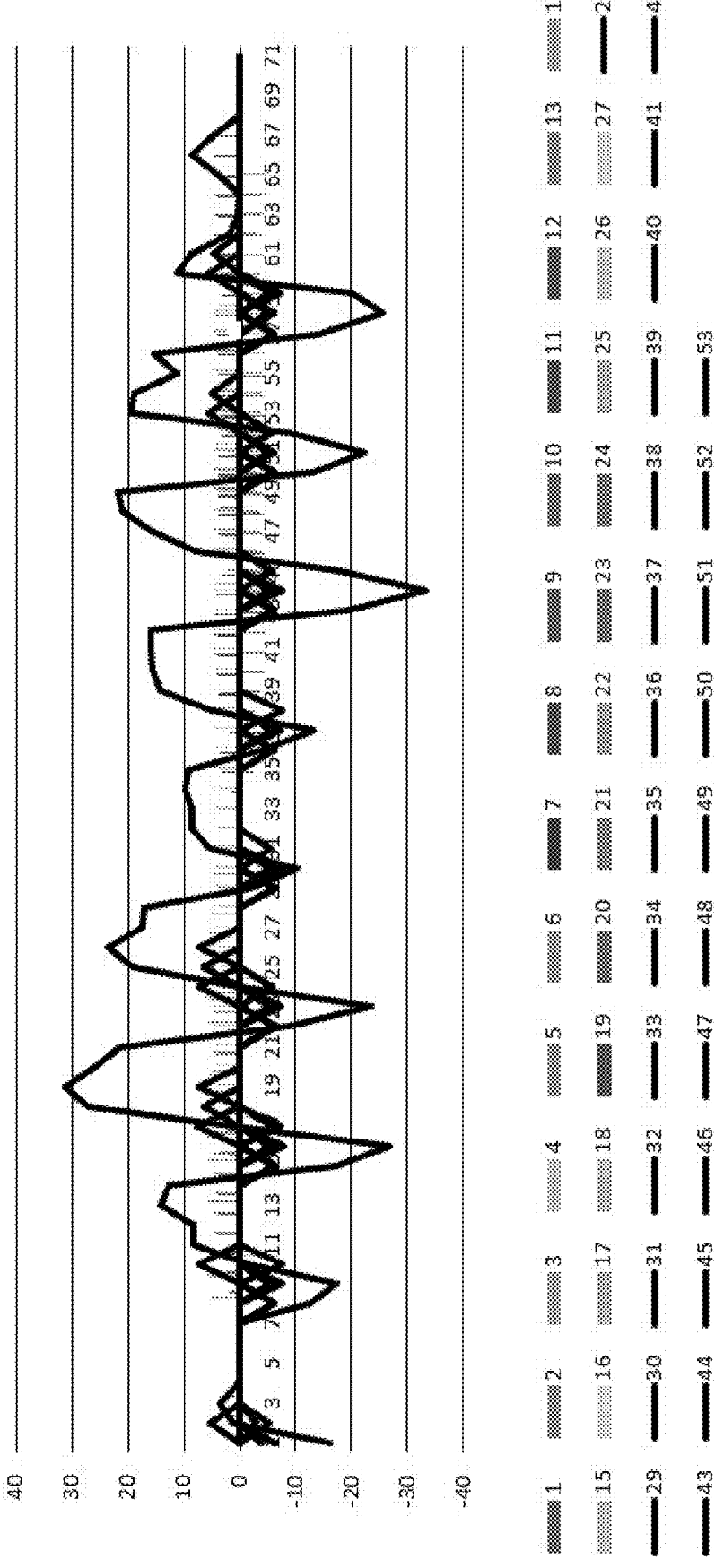
FIG. 5 is a diagram showing a brainwave-like waveform of time series display obtained by superposing charged states of respective cells in respective time slits.

FIG. 5 is a diagram showing a brainwave-like waveform of time series display obtained by superposing the charged states of the respective cells in the respective time slits. Each cell is either an excitatory cell or a repressive cell, and firing of an action potential is determined by whether or not a sum of the inputted excitatory/repressive signals reaches a predetermined value (the threshold).

Figure 6A:
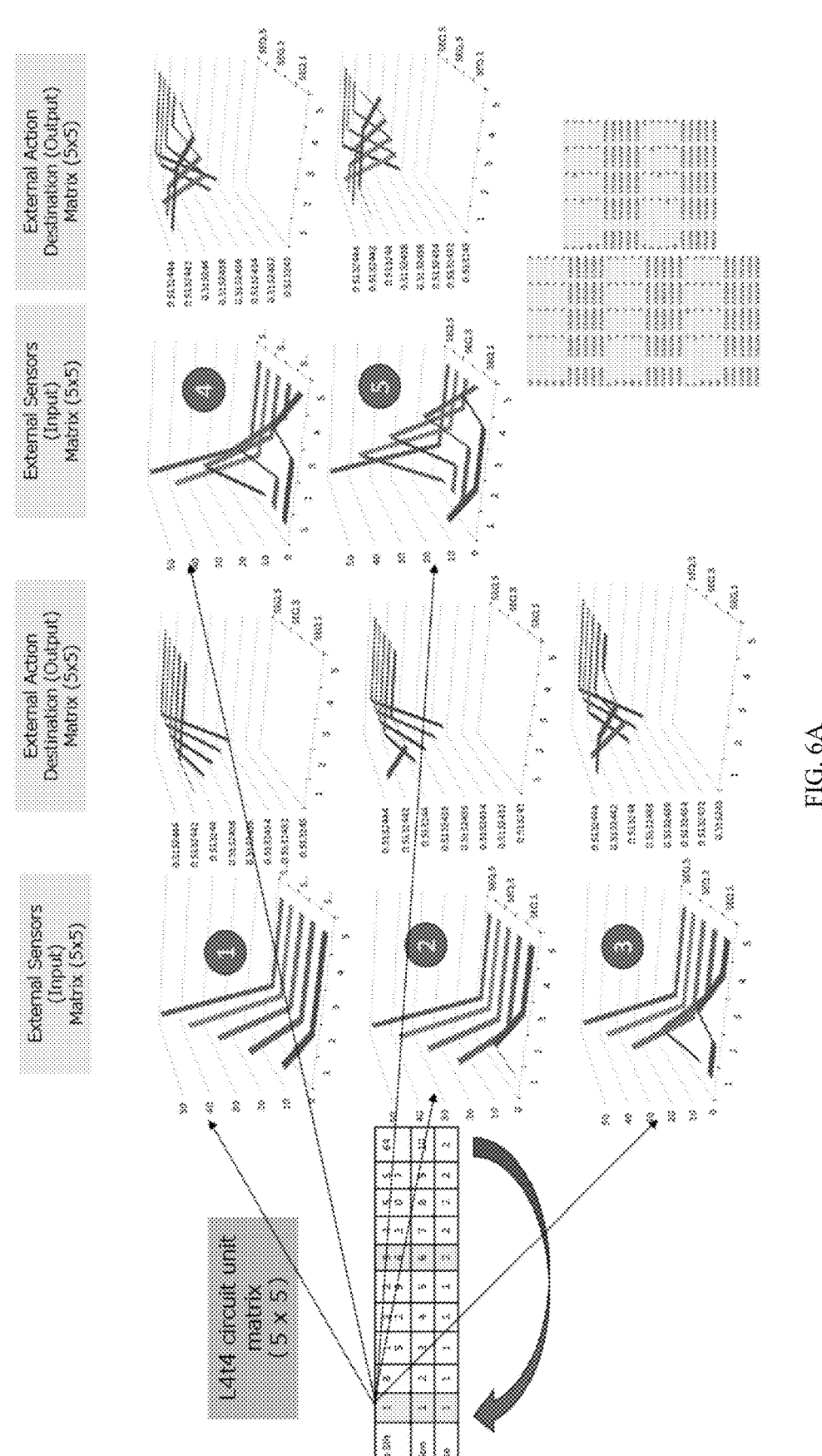
FIG. 6A is a diagram showing output examples outputted from the digital filter circuit of an embodiment of the present invention regarding 5×5 matrix data inputted from the external sensor, where
Figure 6B:
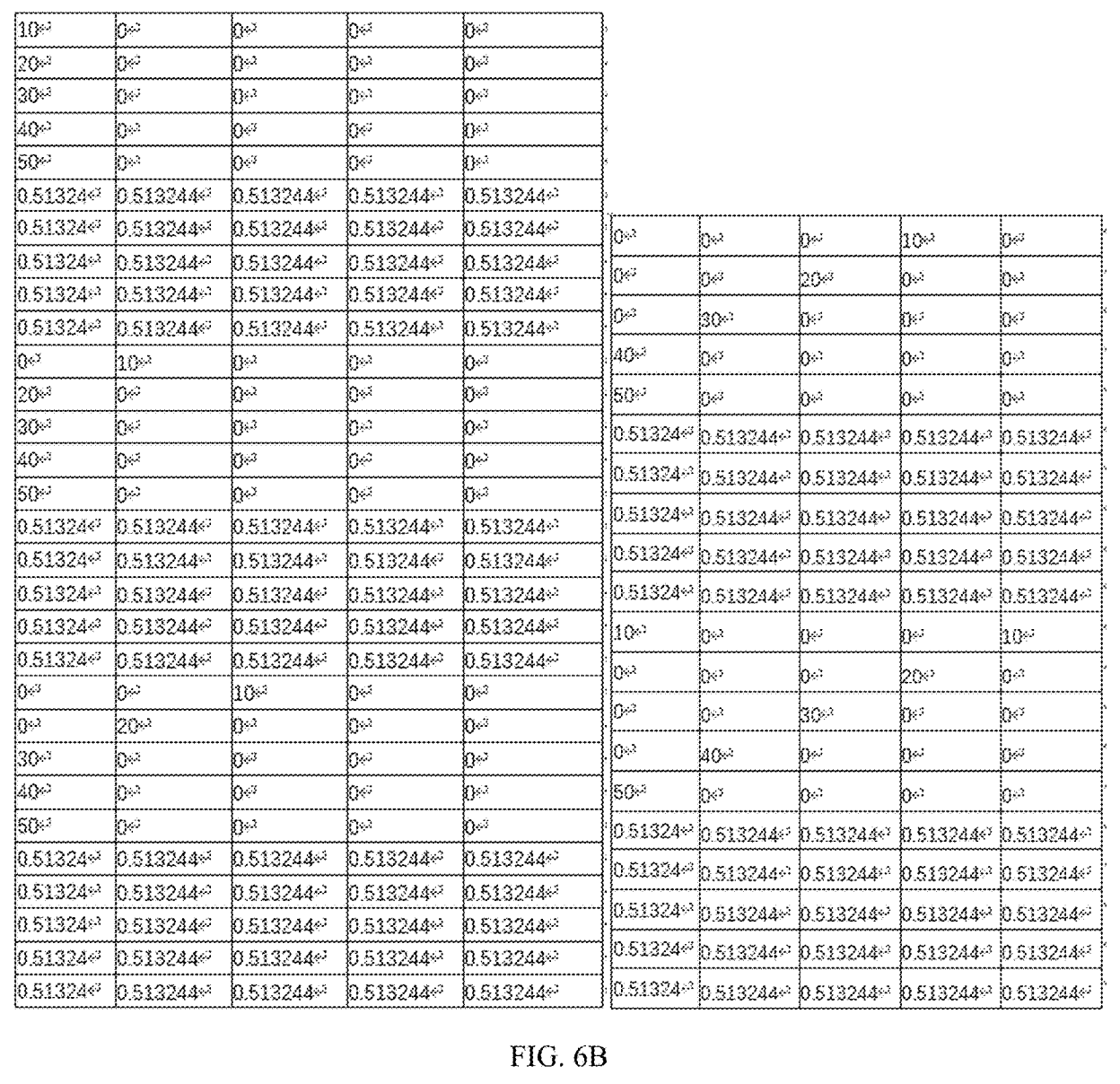

FIG. 6A is a diagram showing output examples outputted from the digital filter circuit of the present embodiment regarding 5×5 matrix data inputted from the external sensor. As shown in FIG. 6A, an image of a change in external environment is successfully reproduced as an internal image. This indicates that the L4t4 circuit has a function of an autoencoder.

Figure 7:
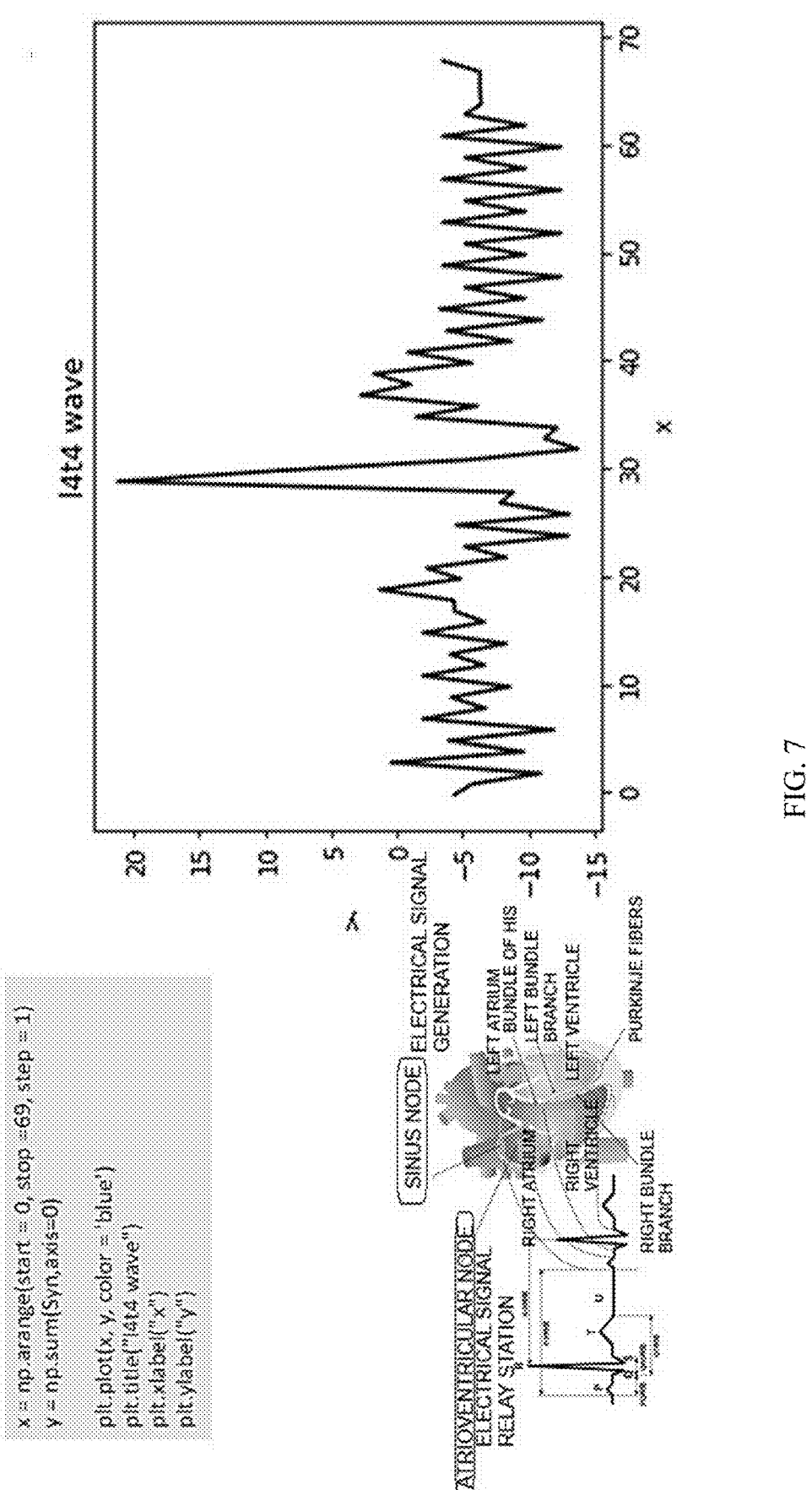
FIG. 7 is a diagram showing waveform data reproduced from data corresponding to neural circuit data of the heart of a nematode.

FIG. 7 is a diagram showing waveform data reproduced from data corresponding to neural circuit data of the heart of a nematode. As shown in FIG. 7, it turns out that electrical signal of the heart can be reproduced from the neural circuit data of the heart of the nematode. Accordingly, it is possible to reproduce and output the electric signal in an artificial heart, for example. This represents that the digital filter circuit has a function that provides a function of the digital filter circuit that can perform emphasis by amplifying, smoothing, or sharpening the input signal appropriately in accordance with a heartbeat (desirable responses and characteristics).

FIG. 8 is a diagram showing fields of application of the digital filter circuit of the present invention. As shown in FIG. 8, the present invention is applicable to various fields including a medical field, a field of nursing care, a field of agriculture, a field of transportation, a field of production, a field of disaster prevention and safety, a chemical field, and the like.

Figure 9:
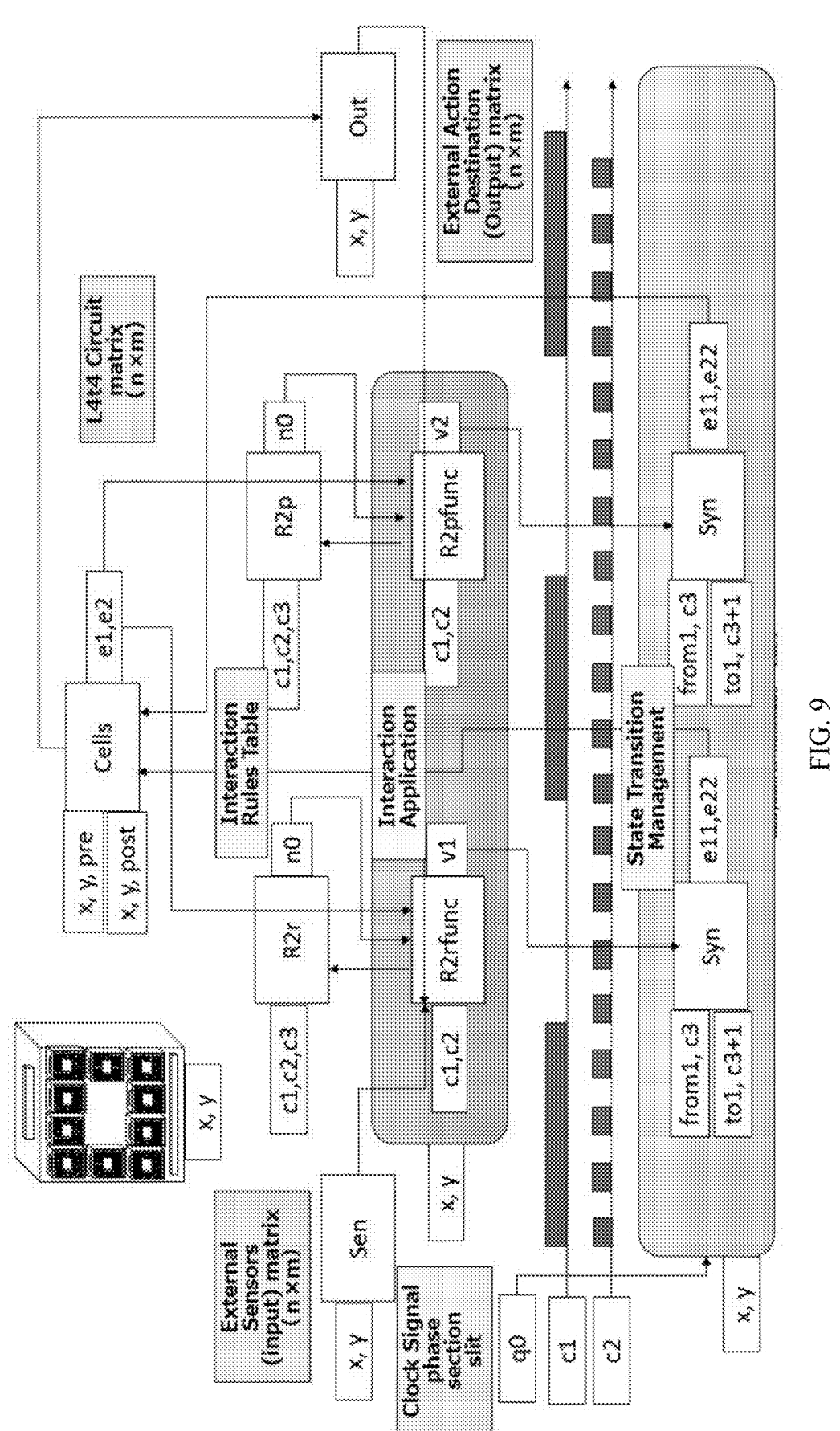
FIG. 9 is a diagram showing a dataflow of present example.

Now, data, programs and the like used in the above-described example will be explained. FIG. 9 is a diagram showing a dataflow of the present example. The stream data from the external sensor are assumed to be an n×m matrix and inputted as values of an element Sen(x, y). The external action target is outputted as a value of an element Out(x, y). Regarding an assembly of the L4t4 circuits, each element is referred to as changes in variables (e1, e2) of an element Cells(x, y, pre/post). A rule of an R2r type of the interaction rule table is referred to as a variable no of an element R2r(c1, c2, c3). A rule of an R2p type of the interaction rule table is referred to as a variable n0 of an element R2p(c1, c2, c3). The phase, the section, and the slit of the clock signal are expressed by variables c1, c2, and c3, respectively. As for interaction application, an element R2rfunc(c1, c2) and an element R2pfunc(c1, c2) are applied. Here, a variable v1 and a variable v2 represent values of weights for firing determined at the timing of each slit. In the state transition management, a variable e11 or a variable e22 obtained by applying an element Syn(from1, c3, to1, c3+1) based on the variable v1 or the variable v2 for the interaction application is reflected to the element Cells.

Figure 10:
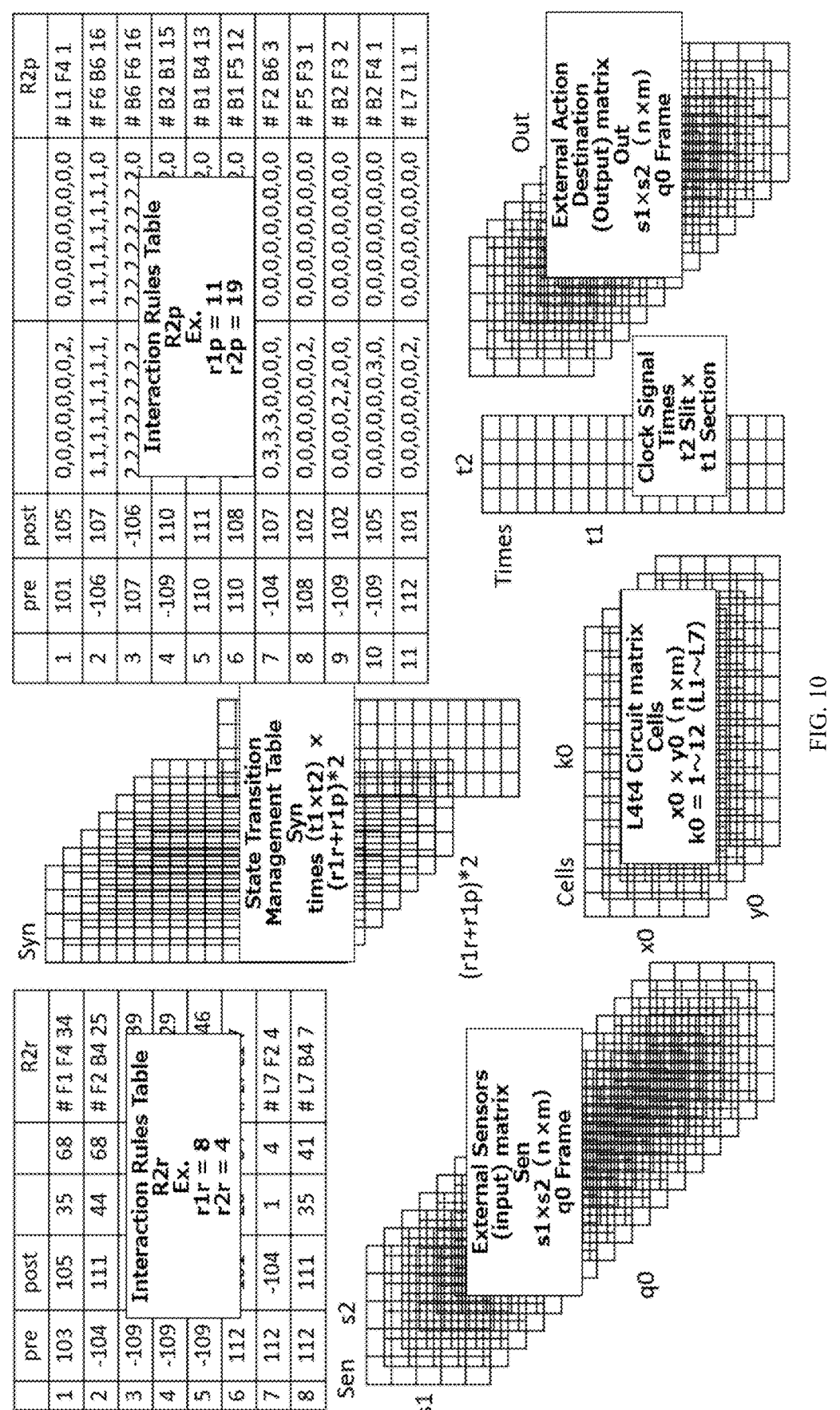
FIG. 10 is a diagram showing a data structure of data used in L4t4 of the present example.
Figure 11:
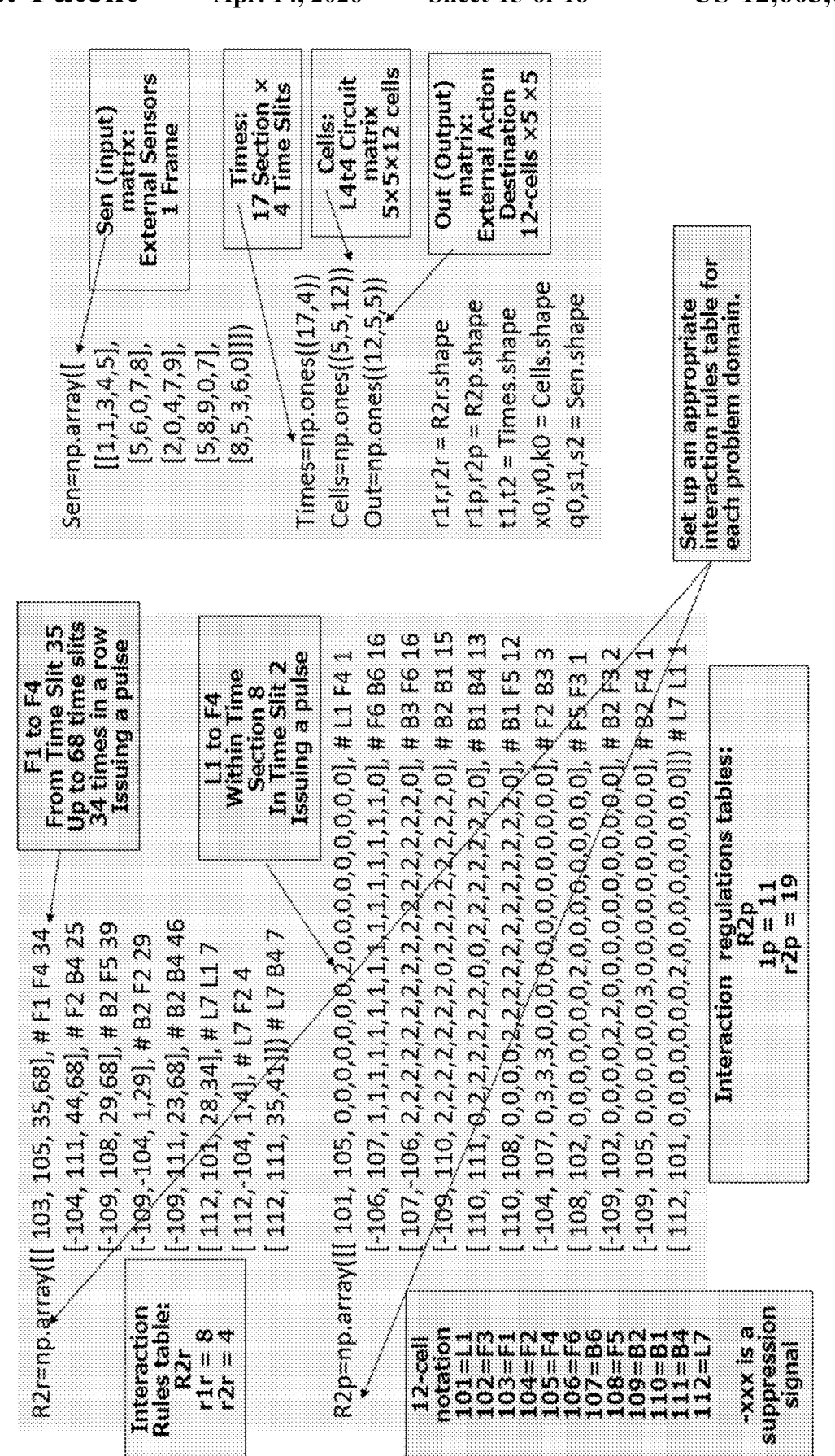

FIG. 10 is a diagram showing a data structure of the data used in the L4t4 of the present example. FIG. 11 is a diagram showing a data example of the interaction rules and the like. As shown in FIG. 10, an interaction rule table R2r is sequence data having a size of r1r×r2r(8×4), for example. A state transition management table Syn Times is sequence data having a size of (t1×t2)×(r1r+r1p)*2, for example. An interaction rule table r2p is sequence data having a size of r1p=11, r2p=19, for example. An external center matrix is formed from q0 pieces of s1×s2 (with a size n×m) sequence data. An L4t4 circuit matrix is sequence data having a size of is formed from x0×y0 (with a size n×m) sequence data, and k0=1 to 12 (corresponding to L1 to L7), for example. A clock signal is sequence data of t2 slits×t1 time sections, for example. An external action target is formed from q0 pieces sequence data of a matrix s1×s2 (with a size n×m), for example.

Figure 12:
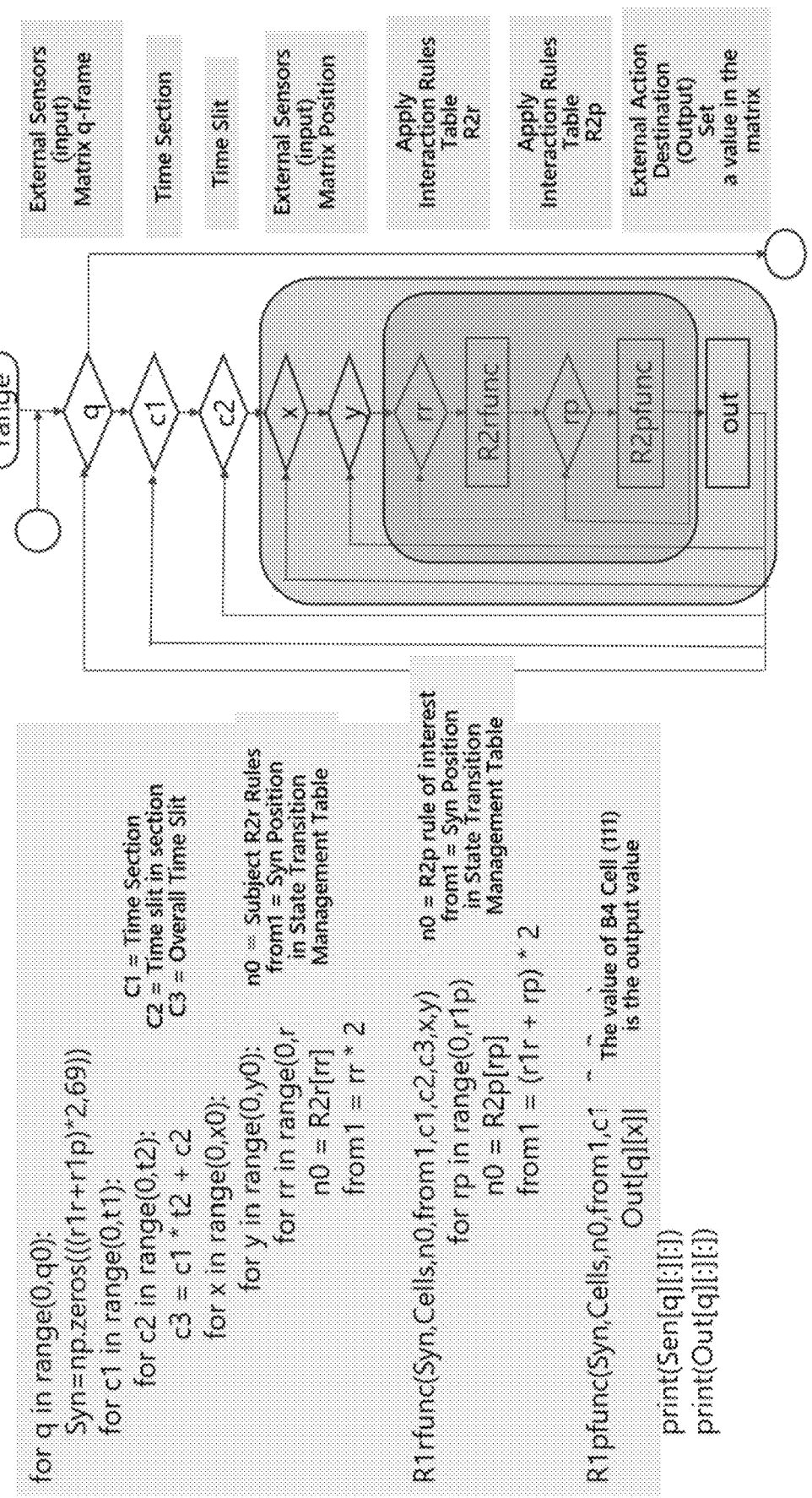
FIG. 12 is a diagram showing computational flows of respective pieces of data.

FIG. 12 is a diagram showing computational flows of respective pieces of data. As shown in FIG. 12, the interaction rule tables R2r and R2p are applied regarding an input matrix of values x and y, respectively, and this processing is repeatedly carried out for each time slit and each time section.

Figure 13:
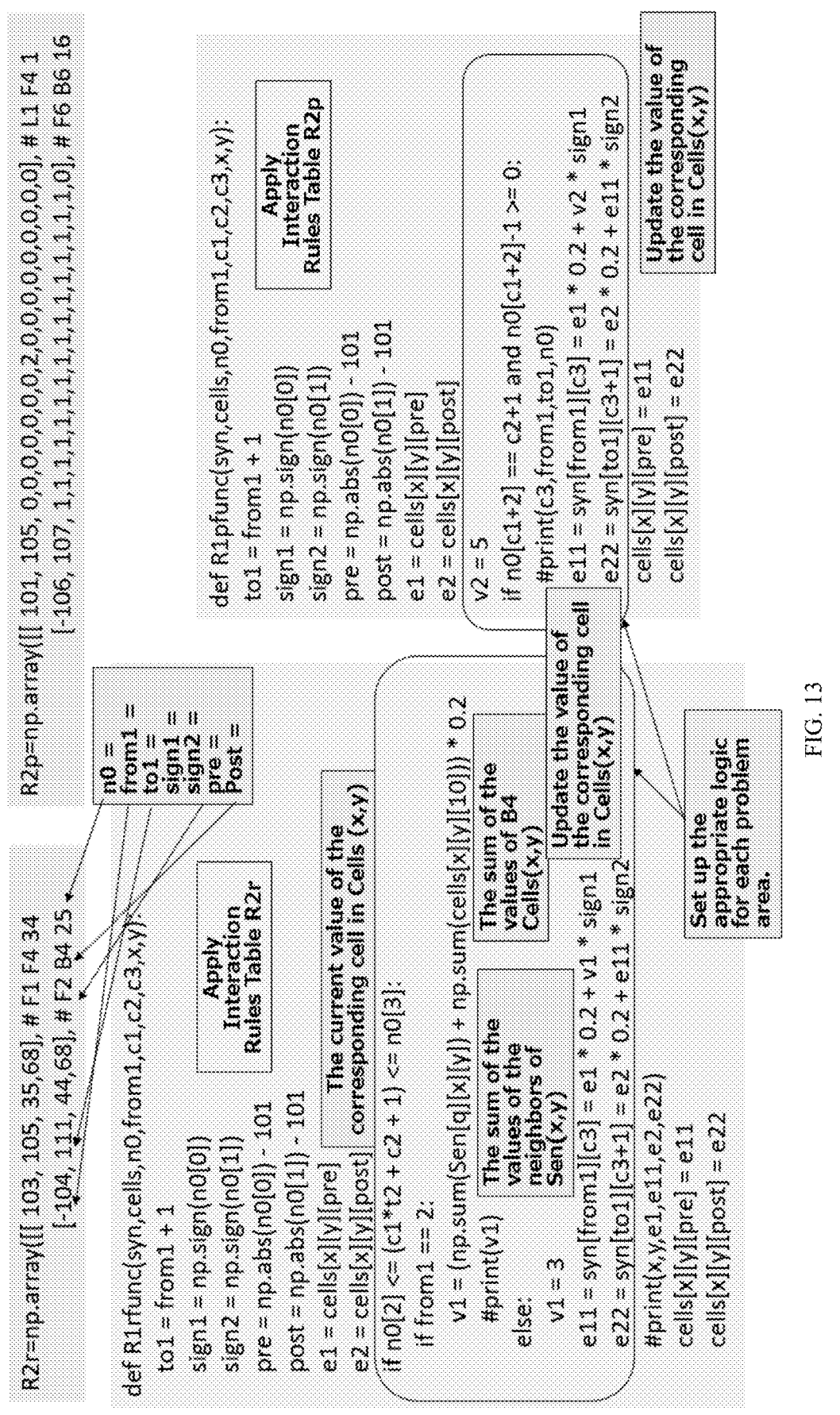
FIG. 13 is a diagram showing contents of respective applied data.
Figure 14:
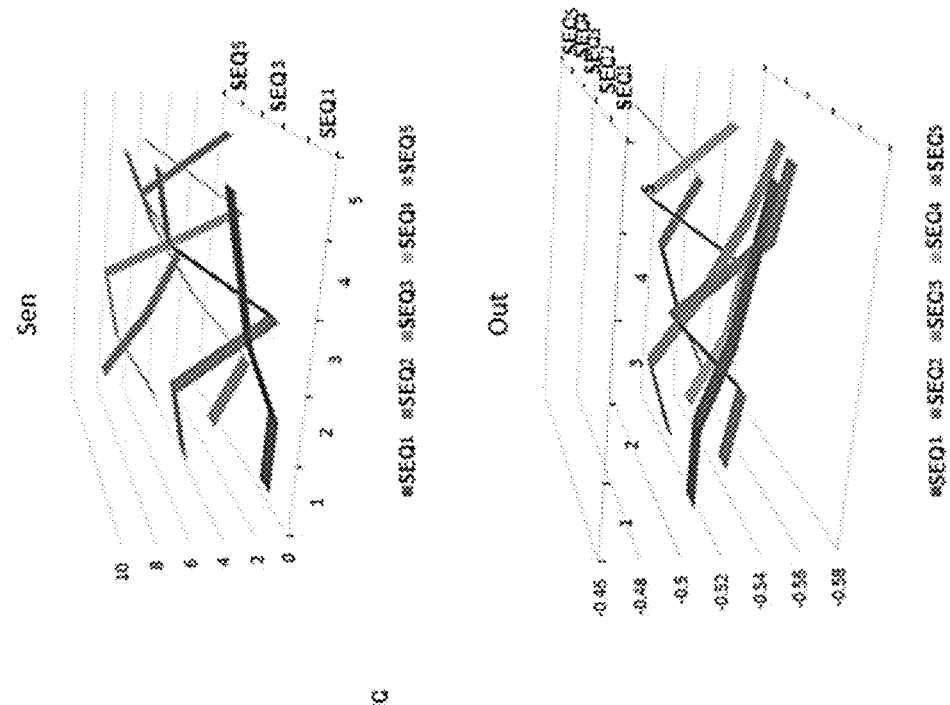
FIG. 14 is a diagram showing the contents of the applied data and examples of outputted data.

FIG. 13 is a diagram showing contents of respective applied data. FIG. 14 is a diagram showing the contents of the applied data and examples of outputted data. As a result of applying the interaction rule tables R2r and R2p as shown FIG. 13, output Out shown in a graph was obtained in response to sensor input Sen as shown in FIG. 14. In this way, the output of phase difference interaction by the L4t4 circuit has been confirmed. In addition, by cyclically changing the state variables, it is possible to amplify, smoothen, and sharpen an input signal into an output signal as intended. As an example, in a case where original data is acoustic wave data, the signal is more likely to be smoothened when a half a wavelength is shifted between the first phase and the second phase, and the signal is more likely to be amplified or sharpened when a wavelength is shifted. Accordingly, it is possible to set cyclic periods of the first phase and the second phase in accordance with a frequency and the like to be amplified or smoothened. By setting lengths of the long-term storage and the short-term storage with an attitude like a moving average regarding the wave, it is possible to adjust whether to react sensitively or to react roughly regarding a change in wave.

Here, it is needless to say that the digital filter circuit of the present invention can be formed by hardware. Instead, the digital filter circuit of the present invention may be realized by causing an MPU (a CPU) or a DSP of a computer and the like to execute a program for a filter. In addition, the digital filter circuit of the present invention is applicable not only to the above-described L4t4 but also to any digital filter as long as it is a filter that can perform phase different output between the first phase and the second phase.

REFERENCE NUMERALS

101 first phase synthesizer
102 second phase synthesizer
103 adjuster

What is claimed is:

1. A digital filter circuit configured to retrieve stream data as a digital signal, and to cyclically operate a first phase and a second phase, comprising:
   a first buffer memory configured to store a local state variable of a first amount of most recent stream data;
   a second buffer memory configured to store a global state variable of a larger amount of most recent stream data than the first buffer memory;
   a first phase synthesizing unit configured to output the digital signal in the first phase under an influence of the local state variable stored in the first buffer memory; and
   a second phase synthesizing unit configured to output the digital signal in the second phase under an influence of the global state variable stored in the second buffer memory, wherein
   an output from the first phase synthesizing unit and an output from the second phase synthesizing unit are caused to generate an interference due to a phase shift.

2. The digital filter circuit according to claim 1, wherein the first buffer memory stores, as the local state variable, data obtained by superposing charged states of respective cells constituting the digital filter circuit in a predetermined term.

3. The digital filter circuit according to claim 2, wherein the second buffer memory stores, as the global state variable, data obtained by superposing the charged states of the respective cells constituting the digital filter circuit in a longer term than the predetermined term.

4. The digital filter circuit according to claim 1, wherein the first phase synthesizing unit reaches firing and performs output when superposition of the digital signal and the local state variable exceeds a predetermined threshold in the first phase.

5. The digital filter circuit according to claim 1, wherein the second phase synthesizing unit reaches firing and performs output when superposition of the digital signal and the global state variable exceeds a predetermined threshold in the second phase.

6. The digital filter circuit according to claim 1, wherein the stream data is any of image data, sound data, heat data, chemical substance data, gravity data, pressure data, vibration data, magnetic wave data, electromagnetic wave data, radiation data, an attribute value pair, language data, and biological data.

7. The digital filter circuit according to claim 1, wherein an interference pattern to be outputted from each of the first phase synthesizing unit and the second phase synthesizing unit is any of an image, a sound, a moving image, an actuator control signal, or a device control signal.

8. A digital filtering method to be executed by a digital filter circuit configured to retrieve stream data as a digital signal and to cyclically operate a first phase and a second phase, the digital filter circuit comprising a first buffer memory configured to store a local state variable of a first amount of most recent stream data and a second buffer memory configured to store a global state variable of a larger amount of most recent stream data than the first buffer memory, the method comprising:
   outputting the digital signal in the first phase under an influence of the local state variable stored in the first buffer memory, and
   outputting the digital signal in the second phase under an influence of the global state variable stored in the second buffer memory, wherein
   an output in the first phase and an output in the second phase are caused to generate an interference due to a phase shift by repeatedly executing the outputting in the first phase and the outputting in the second phase.

9. A non-transitory computer-readable storage medium storing a digital filtering program to be executed by a digital filter circuit configured to retrieve stream data as a digital signal and to cyclically operate a first phase and a second phase, the digital filter circuit comprising a first buffer memory configured to store a local state variable of a first amount of most recent stream data and a second buffer memory configured to store a global state variable of a larger amount of most recent stream data than the first buffer memory, the program causing the digital filter circuit to output the digital signal in the first phase under an influence of the local state variable stored in the first buffer memory, and to output the digital signal in the second phase under an influence of the global state variable stored in the second buffer memory, wherein
   an output in the first phase and an output in the second phase are caused to generate an interference due to a phase shift by repeatedly executing the outputting in the first phase and the outputting in the second phase.

10. The digital filter circuit according to claim 2, wherein the first phase synthesizing unit reaches firing and performs output when superposition of the digital signal and the local state variable exceeds a predetermined threshold in the first phase.

11. The digital filter circuit according to claim 3, wherein the first phase synthesizing unit reaches firing and performs output when superposition of the digital signal and the local state variable exceeds a predetermined threshold in the first phase.

12. The digital filter circuit according to claim 2, wherein the second phase synthesizing unit reaches firing and performs output when superposition of the digital signal and the global state variable exceeds a predetermined threshold in the second phase.

13. The digital filter circuit according to claim 3, wherein the second phase synthesizing unit reaches firing and performs output when superposition of the digital signal and the global state variable exceeds a predetermined threshold in the second phase.

14. The digital filter circuit according to claim 2, wherein the stream data is any of image data, sound data, heat data, chemical substance data, gravity data, pressure data, vibration data, magnetic wave data, electromagnetic wave data, radiation data, an attribute value pair, language data, and biological data.

15. The digital filter circuit according to claim 3, wherein the stream data is any of image data, sound data, heat data, chemical substance data, gravity data, pressure data, vibration data, magnetic wave data, electromagnetic wave data, radiation data, an attribute value pair, language data, and biological data.

16. The digital filter circuit according to claim 2, wherein an interference pattern to be outputted from each of the first phase synthesizing unit and the second phase synthesizing unit is any of an image, a sound, a moving image, an actuator control signal, or a device control signal.

17. The digital filter circuit according to claim 3, wherein an interference pattern to be outputted from each of the first phase synthesizing unit and the second phase synthesizing unit is any of an image, a sound, a moving image, an actuator control signal, or a device control signal.

* * * * *